(12) United States Patent
Senda et al.

(10) Patent No.: US 8,425,807 B2
(45) Date of Patent: Apr. 23, 2013

(54) SOLAR CELL AND COMPOSITION USED FOR MANUFACTURING SOLAR CELL

(75) Inventors: Shinji Senda, Miyoshi (JP); Mamiko Iwaya, Miyoshi (JP)

(73) Assignee: Noritake Co., Ltd, Aichi (JP)

( * ) Notice: Subject to any disclaimer, the term of this patent is extended or adjusted under 35 U.S.C. 154(b) by 290 days.

(21) Appl. No.: 12/746,850

(22) PCT Filed: Nov. 27, 2008

(86) PCT No.: PCT/JP2008/071534
§ 371 (c)(1),
(2), (4) Date: Jun. 8, 2010

(87) PCT Pub. No.: WO2009/075189
PCT Pub. Date: Jun. 18, 2009

(65) Prior Publication Data
US 2010/0252095 A1    Oct. 7, 2010

(30) Foreign Application Priority Data

Dec. 11, 2007    (JP) .................. 2007-319435

(51) Int. Cl.
*H01B 1/02* (2006.01)
*H01B 1/22* (2006.01)

(52) U.S. Cl.
USPC ........ 252/512; 252/501.1; 106/400; 106/403; 136/244; 136/252; 136/256; 136/258

(58) Field of Classification Search ............... 252/501.1, 252/512; 136/252, 256, 224, 258; 106/400, 106/403
See application file for complete search history.

(56) References Cited

U.S. PATENT DOCUMENTS

| | | | | |
|---|---|---|---|---|
| 8,309,844 | B2 * | 11/2012 | Merchant et al. | ............ 136/256 |
| 2001/0029977 | A1 * | 10/2001 | Oya | .............................. 136/256 |
| 2004/0003836 | A1 | 1/2004 | Watsuji et al. | |
| 2007/0138659 | A1 | 6/2007 | Konno | |
| 2007/0215203 | A1 | 9/2007 | Ishikawa et al. | |

FOREIGN PATENT DOCUMENTS

| | | | |
|---|---|---|---|
| JP | 61-208701 A | | 9/1986 |
| JP | 2000-090734 | * | 3/2000 |
| JP | 2000-090734 A | | 3/2000 |
| JP | 2002-109957 | | 4/2002 |
| JP | 2002-109957 A | | 4/2002 |
| JP | 2003-223813 | * | 8/2003 |
| JP | 2003-223813 A | | 8/2003 |

(Continued)

OTHER PUBLICATIONS

Japanese Office Action for Japanese Application No. 2007-319435 mailed on Mar. 8, 2012.
International Search Report for PCT/JP2008/071534 mailed on Feb. 24, 2009.

(Continued)

*Primary Examiner* — Khanh Tuan Nguyen
(74) *Attorney, Agent, or Firm* — Turocy & Watson, LLP

(57) ABSTRACT

A paste-like composition for a solar cell provided by the present invention contains a mixed aluminum powder prepared by mixing a small particle diameter aluminum powder, which has a D50 of particle size distribution based on laser diffraction of 3 μm or less and a ratio of D10 to D90 (D10/D90) of 0.2 or more, and a large particle diameter aluminum powder, which has a D50 that is 2 to 6 times the D50 of the small particle diameter aluminum powder and a ratio of D10/D90 of 0.2 or more.

5 Claims, 7 Drawing Sheets

FOREIGN PATENT DOCUMENTS

| | | | |
|---|---|---|---|
| JP | 2005-191107 | * | 7/2005 |
| JP | 2006-032698 A | | 2/2006 |
| JP | 2007-194581 A | | 8/2007 |

OTHER PUBLICATIONS

Japanese Office Action for Japanese Application No. 2007-319435 mailed on Jan. 4, 2013.

* cited by examiner

US 8,425,807 B2

SOLAR CELL AND COMPOSITION USED FOR MANUFACTURING SOLAR CELL

TECHNICAL FIELD

The present invention relates to a composition used to form an aluminum electrode on the back side of a light-receiving surface of a solar cell and a method for manufacturing the same, and to a solar cell in which the aluminum electrode is formed.

Furthermore, the present application claims priority on the basis of Japanese Patent Application No. 2007-319435, filed on Dec. 11, 2007, the content of which is incorporated herein by reference.

BACKGROUND ART

A solar cell 10 of the single light-receiving surface type as shown in FIG. 1 is conventionally known to be a crystalline silicon solar cell.

This solar cell 10 is provided with an n-Si layer 16 that is formed by forming a p-n junction on the side of the light-receiving surface of a p-Si layer (p-type crystalline silicon) 18 of a silicon substrate (Si wafer) 11, and an anti-reflection film 14, which is composed of titanium oxide or silicon nitride formed by CVD and the like, and a front surface electrode (light-receiving surface electrode) 12, which is typically composed of silver (Ag) and formed by screen-printing a paste-like composition consisting mainly of Ag (Ag paste) followed by baking, are provided on the front surface thereof. On the other hand, a back surface external connection electrode 22, which is composed of Ag and formed by screen-printing and baking an Ag paste in the same manner as the front surface electrode 12, and an aluminum electrode 20, which demonstrates so-called back surface field (BSF) effects, are provided on the back surface of the p-Si layer 18.

This aluminum electrode 20 is formed over roughly the entire back surface by printing and baking a composition prepared in the form of a paste (including a slurry) consisting mainly of aluminum powder (to be simply referred to as an "aluminum paste"). An Al—Si alloy layer not shown is formed during baking, and a p$^+$ layer 24 is formed as a result of the aluminum being dispersed in the p-Si layer 18. As a result of forming this p$^+$ layer 24, or BSF layer, photo-generated carriers are prevented from recombining in the vicinity of the back surface electrode, thereby realizing improvements in short-circuit current or open-circuit voltage (Voc), for example.

However, it is necessary to form the aluminum electrode 20 as a somewhat thick film (for example, 50 to 60 μm) in order to effectively realize the above-mentioned BSF effects. On the other hand, the silicon substrate (silicon wafer) 11, or in other words the solar cell itself, is required to be even thinner than in the past for reasons such as reducing solar cell production costs and making solar cell modules more compact.

However, reducing the thickness of the substrate (silicon wafer) 11 increases the likelihood of the occurrence of warping or bending and the like in the silicon substrate (wafer) itself when baking to form the aluminum electrode 20 due to differences between the coefficient of thermal expansion of the substrate 11 itself and the coefficient of thermal expansion of the aluminum electrode 20. Consequently, various contrivances have been made in the past to prevent the occurrence of this warping and other deformation.

For example, the following Patent Document 1 discloses a paste-like composition (aluminum paste) for forming an aluminum electrode to which is added an aluminum-containing organic compound. In addition, Patent Document 2 discloses an aluminum paste for forming an aluminum electrode that contains an inorganic compound powder that has a coefficient of thermal expansion that is smaller than that of aluminum and has a melting temperature, softening temperature and decomposition temperature that are all higher than those of aluminum. It is described in these patent documents that, by using the aluminum pastes having the characteristics described above, even if the film thickness of the aluminum electrode is thinner than in the past, adequate BSF effects are obtained, and also that by reducing the film thickness of the aluminum electrode, warping and other deformation that occurs in the wafer during baking can be reduced.

Patent Document 1: Japanese Patent Application Laid-open No. 2000-90734

Patent Document 2: Japanese Patent Application Laid-open No. 2003-223813

DISCLOSURE OF THE INVENTION

Although some improvements have been made with respect to the problems of the prior art described above (namely, warping and bending of the wafer that occur when baking the aluminum electrode) as a result of applying the technologies (aluminum pastes) described in these patent publications, there is still room for further improvement.

The present invention was devised to solve the above-mentioned problems of the prior art by employing an approach that differs from that of each of the above-mentioned patent documents, and an object thereof is to provide a composition used to form a thin film aluminum electrode that is able to prevent the occurrence of warping and other deformation of a silicon substrate (wafer) during baking while assuring high BSF effects even when coated in small amounts. In addition, another object of the present invention is to form an aluminum electrode on a silicon substrate (wafer) using the composition, and provide a solar cell provided with this formed aluminum electrode.

One manufacturing method provided by the present invention is a method for manufacturing a paste-like composition used in an application for forming an aluminum electrode of a solar cell. This manufacturing method includes a step of preparing the following two types of aluminum powders:

(a) a small particle diameter aluminum powder, which has a median particle diameter (D50, namely particle diameter at 50% cumulative volume) of particle size distribution based on laser diffraction of 3 μm or less and a ratio of particle diameter at 10% cumulative volume (D10) to particle diameter at 90% cumulative volume (D90) (D10/D90) of 0.2 or more, and (b) a large particle diameter aluminum powder, which has a median particle diameter (D50) of particle size distribution based on laser diffraction that is 2 to 6 times the D50 of the small particle diameter aluminum powder and a ratio of particle diameter at 10% cumulative volume (D10) to particle diameter at 90% cumulative volume (D90)(D10/D90) of 0.2 or more;

a step of mixing the small particle diameter aluminum powder and the large particle diameter aluminum powder at a mixing ratio such that a density (g/cm$^3$) of a dry aluminum film formed using the prepared target paste-like composition is higher than a density (g/cm$^3$) of a dry aluminum film formed using a comparative paste prepared in use of only the small particle diameter aluminum powder as an aluminum component under the same conditions; and a step of dispersing the mixed aluminum powder in an organic vehicle (organic medium).

Furthermore, the above-mentioned dry aluminum film refers to a dry film, obtained by coating a paste-like composition for forming an electrode at a prescribed site, which is dried prior to baking for forming an aluminum electrode.

In addition, the "paste-like composition" here refers to a fluid composition containing one type or a plurality of types of solids dispersed in a prescribed solvent. Thus, the "paste-like composition" here is a term that includes a "slurry-like composition" and "ink-like composition".

In the method for manufacturing a paste-like composition disclosed here, a paste-like composition is prepared by using a mixture of two types of aluminum powders having different particle size distributions as raw material powders for electrode formation as previously described. As a result, the fineness (density) of a film-like aluminum electrode formed on a silicon substrate of a solar cell can be improved, and effects equal to or greater than those of the prior art (such as open circuit voltage Voc) can be demonstrated despite being an electrode film that is thinner than those of the prior art (for example, having a dry film thickness of 30 μm or less, and particularly 20 μm or less). In addition, as a result of being able to reduce the thickness of the electrode film, there is less likelihood of the occurrence of warping and other deformation of the substrate (wafer) during drying or baking after forming a coated film, thereby enabling the manufacturing of a solar cell of a desired shape.

Preferably, the median particle diameter (D50) of the small particle diameter aluminum powder is 1 μm to 3 μm, and the median particle diameter (D50) of the large particle diameter aluminum powder is 5 μm to 10 μm. In addition, the mass (weight) ratio of the large particle diameter aluminum powder to the small particle diameter aluminum powder (large particle diameter aluminum powder/small particle diameter aluminum powder) is preferably set to be within the range of 8/2 to 2/8 in particular.

According to a manufacturing method composed in this manner, fineness (density) of an electrode film (baked aluminum film) can be further improved, and warping of the substrate (wafer) can be reliably prevented while maintaining desired effects.

In addition, the present invention provides a paste-like composition for a solar cell that realizes the above-mentioned object. Namely, the paste-like composition disclosed here is a paste-like composition used in an application for forming an aluminum electrode of a solar cell that comprises an aluminum powder dispersed in an organic vehicle. The paste-like composition is also a paste-like composition that is manufactured according to any of the manufacturing methods of the present invention disclosed herein.

According to the paste-like composition provided by the present invention, an aluminum electrode can be formed that demonstrates effects (such as open circuit voltage Voc) that are equal to or greater than thick films of the prior art (for example, having a dry film thickness of 50 to 60 μm) with an aluminum film that is thinner than those of the prior art (for example, having a dry film thickness of 30 μm or less and particularly 20 μm or less) as previously described. According to the paste-like composition of the present invention, as a result of reducing the thickness of the electrode film, the occurrence of warping and other deformation of a substrate (wafer) during drying or baking after forming a coated film can be prevented.

As a result of mixing the above-mentioned small particle diameter aluminum powder and large particle diameter aluminum powder for the aluminum powder contained in the paste, a mixed powder having a broad particle size distribution, such that the median particle diameter (D50) of particle size distribution based on laser diffraction is 2 μm to 6 μm and the ratio of particle diameter at 10% cumulative volume (D10) to the particle diameter at 90% cumulative volume (D90) (D10/D90) is less than 0.2, is preferable, and the median particle diameter thereof is preferably 3 μm to 5 μm.

As a result of using a paste-like composition having such a constitution, a thin back surface electrode (aluminum electrode), for which warping of a substrate (wafer) can be reliably prevented while maintaining desired effects, can be formed on a thin silicon substrate (Si wafer) having a substrate thickness of, for example, 100 to 500 μm.

In addition, in another aspect thereof for realizing the above-mentioned object, the present invention provides a solar cell provided with an aluminum electrode on the back side of a light-receiving surface. In the solar cell disclosed here, the above-mentioned aluminum electrode is formed by baking a mixed powder consisting of the following two types of aluminum powders:

(a) a small particle diameter aluminum powder, which has a median particle diameter (D50) of particle size distribution based on laser diffraction of 3 μm or less and a ratio of particle diameter at 10% cumulative volume (D10) to particle diameter at 90% cumulative volume (D90) (D10/D90) of 0.2 or more, and (b) a large particle diameter aluminum powder, which has a median particle diameter (D50) of particle size distribution based on laser diffraction that is 2 to 6 times the D50 of the small particle diameter aluminum powder and a ratio of particle diameter at 10% cumulative volume (D10) to particle diameter at 90% cumulative volume (D90) (D10/D90) of 0.2 or more.

For example, the above-mentioned mixed powder is defined by the median particle diameter (D50) of particle size distribution based on laser diffraction being 2 μm to 6 and the ratio of particle diameter at 10% cumulative volume (D10) to particle diameter at 90% cumulative volume (D90) (D10/D90) being less than 0.2.

In a solar cell composed in this manner, there is less likelihood of the occurrence of warping and other deformation of the silicon substrate when forming the aluminum electrode (during drying and/or baking), and as a result, high precision with respect to shape and high reliability with respect to performance can be realized.

This type of solar cell can be obtained by forming an aluminum electrode (back surface electrode) using any paste-like composition disclosed here.

BEST MODE FOR CARRYING OUT THE INVENTION

Figure 1:
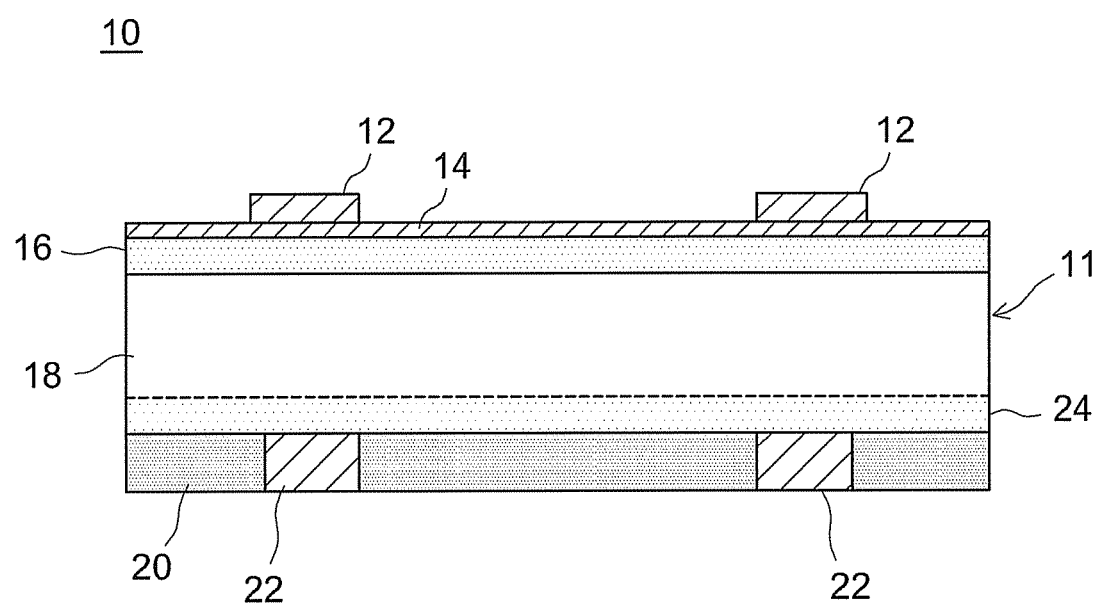
FIG. 1 is a cross-sectional view schematically showing one example of the structure of a solar cell.

The following provides an explanation of preferred embodiments of the present invention. Furthermore, matters required for carrying out the invention (such as method for formulating the paste-like composition or the typical manufacturing process of a solar cell) other than matters specifically mentioned in the present description (such as the types and mixing ratios of the aluminum powders) can be understood to be design matters employed by a person with ordinary skill in the art based on the prior art in the relevant fields. The present invention can be carried out on the basis of the contents disclosed in the present description and technical common sense in the relevant fields.

The paste-like composition disclosed here is a paste-like composition (aluminum paste) used in applications for forming an aluminum electrode in a solar cell, and is a paste-like material characterized by comprising the above-mentioned small particle diameter aluminum powder and large particle diameter aluminum powder having different particle size distributions, while there are no particular limitations on other constituent features and incorporated amounts thereof provided the object of the present invention is able to be realized.

In the present description, an aluminum powder refers to an aggregate of particles consisting mainly of aluminum (Al), and although typically is an aggregate of particles composed of Al units, aluminum powder containing minute amounts of impurities or alloys consisting mainly of Al other than Al can be included in the "aluminum powder" referred to here provided it is an aggregate of particles composed mainly of aluminum overall. Furthermore, the aluminum powder itself may be manufactured according to a conventionally known manufacturing method, and does not require any special manufacturing means.

In addition, with respect to the particle distribution of aluminum powder in the present description, "median particle diameter" refers to particle at 50% cumulative volume in the particle distribution of the powder, or in other words, refers to D50 (median diameter). This D50 can be easily measured by a particle size distribution measuring apparatus based on a laser diffraction method (namely, by irradiating a measurement sample with laser light and measuring particle size distribution according to the scattering pattern when the laser light is scattered).

Although the particles that compose the aluminum powder used are typically spherical, they are not necessarily so-called perfect spheres. Flake-shaped or irregularly shaped particles may also be included.

For example, in the case of the small particle diameter aluminum powder having a median particle diameter of 3 μm or less, 70% by mass (by weight) or more of the particles that compose the powder (primary particles) preferably have a spherical or shape similar thereto. For example, 70% by mass or more of the particles that compose the small particle diameter aluminum powder preferably have an aspect ratio (namely ratio of the long axis to the short axis) of 1 to 1.3.

On the other hand, the large particle diameter aluminum powder preferably contains microscopically long, narrow particles having an aspect ratio of 1.3 or more (for example, 70% by mass or more of the particles that compose the powder are particles having an aspect ratio of 1.3 or more). By mixing a large particle diameter aluminum powder and small particle diameter aluminum powder having such shapes, a highly fine (namely, high-density) target aluminum electrode can be formed.

In addition, the two types of mixed powders are preferably powders that each has a comparatively narrow particle size distribution (or in other words, uniform particle diameter). The ratio of particle diameter at 10% cumulative volume in particle size distribution based on laser diffraction (D10) to the particle diameter at 90% cumulative volume (D90) (D10/D90) can be used as an indicator thereof. In the case the particle diameters of the particles that compose the powder are all equal, the value of D10/D90 is 1, while conversely, the value of D10/D90 approaches 0 the broader the particle size distribution. Powders having a comparatively narrow particle size distribution such that the above-mentioned value of D10/D90 is 0.2 or more (and for example, 0.2 to 0.4) are used preferably.

In addition, in the case of forming an aluminum electrode on one surface of a silicon substrate that composes a solar cell (and typically the back side of a light-receiving surface), film thickness in the state of a dry coated film prior to drying (namely, a dry aluminum film) is preferably 30 μm or less, and typically about 20 μm (for example, 15 to 25 μm, particularly preferably 20 μm or less, and for example 10 to 20 μm) from the viewpoint of realizing the object of the present invention.

An example of a small particle diameter aluminum powder preferable for composing such a dry coated film is a powder having a median particle diameter (D50) of 3 μm or less (for example, 1 μm to 3 μm and particularly 1.5 μm to 2.5 μm). On the other hand, a large particle diameter aluminum powder that mixed with this small particle diameter aluminum powder is preferably a large particle diameter aluminum powder having a median particle diameter (D50) that is roughly 2 to 6 times the median particle diameter (D50) of the small particle diameter aluminum powder. For example, two types of aluminum powders are preferably used such that the median particle diameter (D50) of the small particle diameter aluminum powder is 3 μm or less (for example, 1 μm to 3 μm and particularly 1.5 μm to 2.5 μm), and the median particle diameter (D50) of the large particle diameter aluminum powder is 5 μm or more (for example, 5 μm to 10 μm and particularly 5.5 μM to 8.5 μm).

From the above-mentioned viewpoints (such as particle size distribution or particle shape), from the viewpoints as described above (such as particle size distribution and particle shape), in preparing the paste-like composition as claimed in the present invention, there are no particular limitations on the mixing ratio of the prepared small particle diameter aluminum powder and large particle diameter aluminum powder, and both aluminum powders are mixed at a blending ratio such that the density (g/cm³) of a dry aluminum film formed using the target paste-like composition prepared by mixing the small particle diameter aluminum powder and the large particle diameter aluminum powder is higher than the density of a dry aluminum film formed using a comparative paste-like composition prepared using only the small particle diameter aluminum powder as an aluminum component under the same conditions.

For example, the mass-based (weight-based) mixing ratio of the large particle diameter aluminum powder to the small particle diameter aluminum powder (large particle diameter aluminum powder/small particle diameter aluminum powder) is preferably set within a range of 8/2 to 2/8. This mixing ratio is particularly preferably set within a range of 7/3 to 3/7 (and particularly 6/4 to 4/6, and for example, about 5/5).

In addition, a mixed powder is preferably prepared so that the particle size distribution of a mixed powder obtained following mixing of the small particle diameter aluminum powder and the large particle diameter aluminum powder is preferably such that the median particle diameter (D50) is 2 µm to 6 µm and the ratio of D10/D90 is less than 0.2 (and typically 0.1 to less than 0.2). The small particle diameter aluminum powder and large particle diameter aluminum powder are particularly preferably mixed so that the median particle diameter (D50) of the entire aluminum powder after mixing is 3 µm to 5 µm.

A paste-like composition having for a main component thereof a mixed powder characterized by having such a particle size distribution enables a fine aluminum electrode to be formed on a silicon substrate. In addition, the dispersibility of the powder in the paste can be satisfactorily maintained. It is extremely difficult to realize such particle size distribution characteristics with only a single aluminum powder, and can be realized by mixing two types of aluminum powders having different particle size distributions as disclosed here.

Although there are no particular limitations on the content of aluminum powder (mixed powder) in the paste, the content thereof is preferably adjusted so that the aluminum powder accounts for 60 to 80% by mass (for example, 70 to 80% by mass) based on a value of 100% by mass for the entire paste. In the case the content of aluminum powder in the resulting paste-like composition is as described above, an aluminum electrode film can be formed in which fineness is even further improved.

Next, an explanation is provided of materials other than the aluminum powder used in the case of manufacturing a paste-like composition.

An example of an auxiliary component of the paste-like composition is an organic vehicle used to disperse the aluminum powder. The organic solvent that composes the vehicle is a solvent capable of favorably dispersing the aluminum powder, and solvents conventionally used for this type of paste can be used without any particular limitations. For example, one type or a combination of two or more types of high boiling point solvents, such as ethylene glycol and diethylene glycol derivatives (glycol ether-based solvents), toluene, xylene, butyl carbitol (BC) or terpineol, can be used as a solvent that composes the vehicle.

In addition, various resin components can be contained as an organic binder that composes the vehicle. Such resin components make it possible to impart favorable viscosity and coated film formability (adhesion to the silicon substrate) to the paste-like composition, and conventional resin components used in this type of paste-like composition (aluminum pastes or the above-mentioned Ag paste) can be used without any particular limitations. Examples of such resin components include those composed mainly of acrylic resin, epoxy resin, phenol resin, alkyd resin, cellulose-based polymers, polyvinyl alcohol or rosin resin. Among these, cellulose-based polymers such as ethyl cellulose are particularly preferable.

Although there are no particular limitations on the organic vehicle content, an amount of about 15 to 35% by mass of the total mass of the paste is suitable.

Examples of other auxiliary components of the paste-like composition include various inorganic additives, and typically glass fit, that contribute to improved adhesive strength of the aluminum electrode to the silicon substrate. Preferable examples of glass frit include zinc glass, lead glass, borosilicate glass, bismuth oxide and combinations of two or more types thereof. Specific preferable examples of glass frit include glass consisting mainly of $B_2O_3$, $SiO_2$ or ZnO ($B_2O_3$—$SiO_2$—ZnO-based glass), glass consisting mainly of PbO, $B_2O_3$ and ZnO (PbO—$B_2O_3$—ZnO-based glass), glass consisting mainly of $Bi_2O_3$, $B_2O_3$ and ZnO ($Bi_2O_3$—$B_2O_3$—ZnO-based glass), glass consisting mainly of $B_2O_3$, $SiO_2$ and PbO ($Bi_2O_3$—$SiO_2$—PbO-based glass), glass consisting mainly of $B_2O_3$, SiO and $Bi_2O_3$ ($B_2O_3$—SiO—$Bi_2O_3$-based glass), glass consisting mainly of $SiO_2$, $Bi_2O_3$ and PbO ($SiO_2$—$Bi_2O_3$—PbO-based glass), and glass consisting mainly of PbO, $B_2O_3$ and $Al_2O_3$ (PbO—$B_2O_3$—$Al_2O_3$-based glass). Glass frit added to stably bake and adhere (enamel) paste components (coated film) adhered to a silicon substrate (wafer) preferably has a specific surface area of about 0.5 to 50 $m^2/g$, and particularly preferably has a median particle diameter of 2 µm or less (and particularly about 1 µm or less). Although there are no particular limitations on the glass frit content, an amount of about 0.5 to 5% by mass based on the total mass of the paste-like composition is suitable.

The paste-like composition disclosed here can be easily prepared by typically mixing an aluminum powder (small particle diameter aluminum powder and large particle diameter aluminum powder), an organic vehicle and other additives (such as glass frit) in the same manner as conventional paste-like compositions for solar cells. For example, a prescribed mixed ratio of small particle diameter aluminum powder and large particle diameter aluminum powder and various types of additives (glass frit) are mixed and stirred at a prescribed blending ratio using a three roll mill or other kneading machine.

The paste-like composition provided by the present invention can be handled in the same manner as paste-like compositions conventionally used to form a back surface aluminum electrode (and ultimately a p⁺ layer, or BSF layer) on a silicon substrate, and conventionally known methods can be employed without any particular limitations.

Typically, the paste-like composition is coated onto a silicon substrate (wafer) to a desired thickness and coated film pattern by a method such as screen printing, dispenser coating or dip coating. Next, the coated film is dried at a suitable temperature (room temperature to about 100° C.). After drying, the coated film is heated for a prescribed amount of time in a suitable baking oven (such as a high-speed baking oven) under suitable heating conditions (for example, 700 to 800° C.). As a result, a coated film is baked onto the silicon substrate resulting in the formation of the aluminum electrode 20 as shown in FIG. 1. Normally, the p⁺ layer (BSF layer) 24 can also be formed accompanying formation of the aluminum electrode 20.

According to the paste-like composition provided by the present invention, since the paste-like composition is mainly composed of a mixed powder of small particle diameter aluminum powder and large particle diameter aluminum powder, a BSF layer (p+ layer), equivalent to the case of forming (baking) a conventional thin aluminum electrode (having a film thickness of, for example, 50 to 60 µm), can be formed when forming (baking) a thinner aluminum electrode (having a film thickness of, for example, 30 µm or less and typically 15 to 25 µm). As a result of reducing the thickness of the aluminum electrode, the occurrence of warping and other deformation or cracking and the like in the silicon substrate, which is caused by a difference between the coefficient of thermal expansion of the silicon substrate and the coefficient of thermal expansion of the aluminum film during drying of the coated paste and baking of the dry aluminum film, can be prevented in advance.

Furthermore, materials and processes for manufacturing a solar cell other than forming an aluminum electrode having a film thickness that is less than that of the prior art by using the paste-like composition of the present invention are the same as in the prior art, and a crystalline silicon solar cell provided with an aluminum electrode formed with the paste-like composition of the present invention (an example of which can be seen by referring to the above-mentioned FIG. 1) can be manufactured without any special treatment. For example, Ag electrodes of a prescribed pattern can be formed on a light-receiving surface and back surface by carrying out screening printing and the like using conventional Ag paste. In addition, an n+ layer or anti-reflection film can be formed by carrying out treatment in the same manner as that of the prior art.

The manufacturing process itself of such a solar cell (element) may be identical to that of the prior art, and a detailed description thereof is omitted since it does particularly characterize the present invention.

Although the following provides an explanation of several examples relating to the present invention, the present invention is not intended to be limited to that indicated in these examples. Furthermore, values relating to particle size distribution described below are the result of measurements using ion exchange water as a dispersion medium, and using a laser diffraction/scattering particle size distribution analyzer (LA-920, Horiba).

Production Example 1

Preparation of Paste-Like Composition (Aluminum Paste) (1)

Aluminum powder having a median particle diameter (D50) of 6.5 µm (D10: 3.8 µm, D90: 12.2 µm, D10/D90=0.311) was used for the large particle diameter aluminum powder, and aluminum powder having a median particle diameter (D50) of 2.2 µm (D10: 0.9 µm, D90: 4.0 µm, D10/D90=0.225) was used for the small particle diameter aluminum powder.

The two types of aluminum powders were mixed so that the mass-based mixing ratio of the large particle diameter aluminum powder to the small particle diameter aluminum powder (large/small) was 8/2, and 23 parts by mass (by weight) of an organic vehicle (terpineol: 21.5 parts by mass, ethyl cellulose: 1.5 parts by mass) and 2 parts by mass of glass frit (zinc glass: $B_2O_3$—$SiO_2$—ZnO-based glass) were added to 75 parts by mass of the mixed powder followed by kneading using a three roll mill. As a result, a paste-like composition as claimed in this production example (aluminum powder content: 75% by mass) was prepared. The resulting paste-like composition is hereinafter referred to as Sample 1.

Production Example 2

Preparation of Paste-Like Composition (Aluminum Paste) (2)

A paste-like composition as claimed in the present production example (aluminum powder content: 75% by mass) was prepared by using the same materials and carrying out the same process as Production Example 1 with the exception of changing the mass-based mixing ratio of the large particle diameter aluminum powder to the small particle diameter aluminum powder (large/small) to 7/3. The resulting paste-like composition is hereinafter referred to as Sample 2.

Production Example 3

Preparation of Paste-Like Composition (Aluminum Paste) (3)

A paste-like composition as claimed in the present production example (aluminum powder content: 75% by mass) was prepared by using the same materials and carrying out the same process as Production Example 1 with the exception of changing the mass-based mixing ratio of the large particle diameter aluminum powder to the small particle diameter aluminum powder (large/small) to 5/5. The resulting paste-like composition is hereinafter referred to as Sample 3.

Production Example 4

Preparation of Paste-Like Composition (Aluminum Paste) (4)

A paste-like composition as claimed in the present production example (aluminum powder content: 75% by mass) was prepared by using the same materials and carrying out the same process as Production Example 1 with the exception of changing the mass-based mixing ratio of the large particle diameter aluminum powder to the small particle diameter aluminum powder (large/small) to 3/7. The resulting paste-like composition is hereinafter referred to as Sample 4.

Production Example 5

Preparation of Paste-Like Composition (Aluminum Paste) (5)

A paste-like composition as claimed in the present production example (aluminum powder content: 75% by mass) was prepared by using the same materials and carrying out the same process as Production Example 1 with the exception of changing the mass-based mixing ratio of the large particle diameter aluminum powder to the small particle diameter aluminum powder (large/small) to 2/8. The resulting paste-like composition is hereinafter referred to as Sample 5.

Production Example 6

Preparation of Paste-Like Composition (Aluminum Paste) (6)

A paste-like composition as claimed in the present production example (aluminum powder content: 75% by mass) was prepared by using the same materials and carrying out the same process as Production Example 1 with the exception of changing the mass-based mixing ratio of the large particle diameter aluminum powder to the small particle diameter aluminum powder (large/small) to 9/1. The resulting paste-like composition is hereinafter referred to as Sample 6.

Production Example 7

Preparation of Paste-Like Composition (Aluminum Paste) (7)

A paste-like composition as claimed in the present production example (aluminum powder content: 75% by mass) was prepared by using the same materials and carrying out the same process as Production Example 1 with the exception of changing the mass-based mixing ratio of the large particle diameter aluminum powder to the small particle diameter aluminum powder (large/small) to 10/0, or in other words, using only the large particle diameter aluminum powder. The resulting paste-like composition is hereinafter referred to as Sample 7.

Production Example 8

Preparation of Paste-Like Composition (Aluminum Paste) (8)

A paste-like composition as claimed in the present production example (aluminum powder content: 75% by mass) was prepared by using the same materials and carrying out the same process as Production Example 1 with the exception of changing the mass-based mixing ratio of the large particle diameter aluminum powder to the small particle diameter aluminum powder (large/small) to 0/10, or in other words, using only the small particle diameter aluminum powder. The resulting paste-like composition is hereinafter referred to as Sample 8.

Production Example 9

Preparation of Paste-Like Composition (Aluminum Paste) (9)>

A paste-like composition as claimed in the present production example (aluminum powder content: 75% by mass) was prepared by using the same materials and carrying out the same process as Production Example 1 with the exception of using only an aluminum powder having a median particle diameter (D50) of 4.0 μm (D10: 2.4 μm, D90: 7.4 μm, D10/D90=0.324) for the aluminum powder. The resulting paste-like composition is hereinafter referred to as Sample 9.

Production Example 10

Preparation of Paste-Like Composition (Aluminum Paste) (10)

Aluminum powder having a median particle diameter (D50) of 5.5 μm (D10: 2.5 μm, D90: 9.9 μm, D10/D90=0.253) was used for the large particle diameter aluminum powder, and aluminum powder having a median particle diameter (D50) of 2.2 μm (D10: 0.9 μm, D90: 4.0 μm, D10/D90=0.225) was used for the small particle diameter aluminum powder.

The two types of aluminum powders were mixed so that the mass-based mixing ratio of the large particle diameter aluminum powder to the small particle diameter aluminum powder (large/small) was 5/5, and 23 parts by mass of an organic vehicle (terpineol: 21.5 parts by mass, ethyl cellulose: 1.5 parts by mass) and 2 parts by mass of glass frit (zinc glass: $B_2O_3$—$SiO_2$—ZnO-based glass) were added to 75 parts by mass of the mixed powder followed by kneading using a three roll mill. As a result, a paste-like composition as claimed in this production example (aluminum powder content: 75% by mass) was prepared. The resulting paste-like composition is hereinafter referred to as Sample 10.

Production Example 11

Preparation of Paste-Like Composition (Aluminum Paste) (11)

A paste-like composition as claimed in the present production example (aluminum powder content: 75% by mass) was prepared by using the same materials and carrying out the same process as Production Example 10 with the exception of changing the large particle diameter aluminum powder used to aluminum powder having a median particle diameter (D50) of 8.5 μm (D10: 4.0 μm, D90: 14.6 μm, D10/D90=0.273). The resulting paste-like composition is hereinafter referred to as Sample 11.

Production Example 12

Preparation of Paste-Like Composition (Aluminum Paste) (12)

Aluminum powder having a median particle diameter (D50) of 6.5 vim (D10: 3.8 μm, D90: 12.2 μm, D10/D90=0.311) was used for the large particle diameter aluminum powder, and aluminum powder having a median particle diameter (D50) of 2.2 μm (D10: 0.9 μm, D50: 2.2 μm, D90: 4.1 μm, D10/D90=0.22) was used for the small particle diameter aluminum powder.

The two types of aluminum powders were mixed so that the mass-based mixing ratio of the large particle diameter aluminum powder to the small particle diameter aluminum powder (large/small) was 5/5, and 23 parts by mass of an organic vehicle (terpineol: 21.5 parts by mass, ethyl cellulose: 1.5 parts by mass) and 2 parts by mass of glass frit (zinc glass: $B_2O_3$—$SiO_2$—ZnO-based glass) were added to 75 parts by mass of the mixed powder followed by kneading using a three roll mill. As a result, a paste-like composition as claimed in this production example (aluminum powder content: 75% by mass) was prepared. The resulting paste-like composition is hereinafter referred to as Sample 12.

Production Example 13

Preparation of Paste-Like Composition (Aluminum Paste) (13)

A paste-like composition as claimed in the present production example (aluminum powder content: 75% by mass) was prepared by using the same materials and carrying out the same process as Production Example 12 with the exception of changing the small particle diameter aluminum powder used to aluminum powder having a median particle diameter (D50) of 4.0 μm (D10: 2.4 μm, D90: 7.4 μm, D10/D90=0.324). The resulting paste-like composition is hereinafter referred to as Sample 13.

Production Example 14

Preparation of Paste-Like Composition (Aluminum Paste) (14)

Aluminum powder having a median particle diameter (D50) of 4.0 μm (D10: 2.4 μm, D90: 7.4 μm, D10/

D90=0.324) was used for the large particle diameter aluminum powder, and aluminum powder having a median particle diameter (D50) of 2.2 μm (D10: 0.9 μm, D90: 4.0 μm, D10/D90=0.225) was used for the small particle diameter aluminum powder.

The two types of aluminum powders were mixed so that the mass-based mixing ratio of the large particle diameter aluminum powder to the small particle diameter aluminum powder (large/small) was 5/5, and 23 parts by mass of an organic vehicle (terpineol: 21.5 parts by mass, ethyl cellulose: 1.5 parts by mass) and 2 parts by mass of glass frit (zinc glass: $B_2O_3$—$SiO_2$—ZnO-based glass) were added to 75 parts by mass of the mixed powder followed by kneading using a three roll mill. As a result, a paste-like composition as claimed in this production example (aluminum powder content: 75% by mass) was prepared. The resulting paste-like composition is hereinafter referred to as Sample 14.

Test Example 1

Measurement of Dry Film Density

Density of dry aluminum films (foil) was measured on a soda glass substrate. More specifically, aluminum pastes of Samples 1 to 14 obtained as described above were printed (coated) onto a glass substrate by screen printing (using stainless steel screen mesh SUS #165) to form coated films measuring 100 mm×100 mm. At this time, two types of coated films were prepared having film thicknesses of the dry coated films of 20 μm and 30 μm by adjusting the coated amounts thereof. Following completion of coating, the coated films were dried at room temperature to 80° C., and the densities of the resulting dry aluminum films were calculated from measurements of the adhered amount and thickness of the dry films. The results are divided between Tables 1 and 2 for each of the aluminum pastes used.

As is clear from the results shown in the tables, the use of mixed aluminum powder in which large particle diameter aluminum powder and small particle diameter aluminum powder are mixed at a suitable ratio was confirmed to be able to improve dry aluminum film density.

More specifically, in Samples 1 to 5 and 10 to 12, in which large particle diameter aluminum powder having a median particle diameter of 5 μm or more and small particle diameter aluminum powder having a median particle diameter of 3 μm or less were mixed so that the mixing ratio (large/small) was within the range of 8/2 to 2/8, greater improvement of dry film density was observed as compared with that in which only large particle diameter aluminum powder was used (Sample 7) or that in which only small particle diameter aluminum powder was used (Sample 8).

In particular, dry film density of 2 g/cm$^3$ or more was obtained in Samples 2 to 4 and 10 to 12 in which the mixing ratio (large/small) was set to within the range of 7/3 to 3/7.

Figure 2A:
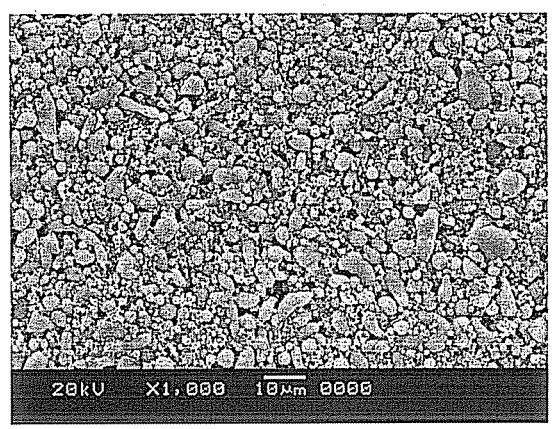
FIG. 2A is an SEM micrograph (magnification: ×1000) of a dry aluminum film as claimed in a manufacturing example.
Figure 2B:
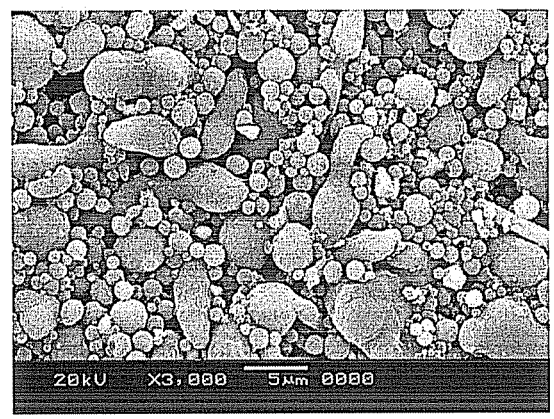
FIG. 2B is an SEM micrograph (magnification: ×3000) of a dry aluminum film as claimed in a manufacturing example.
Figure 2C:
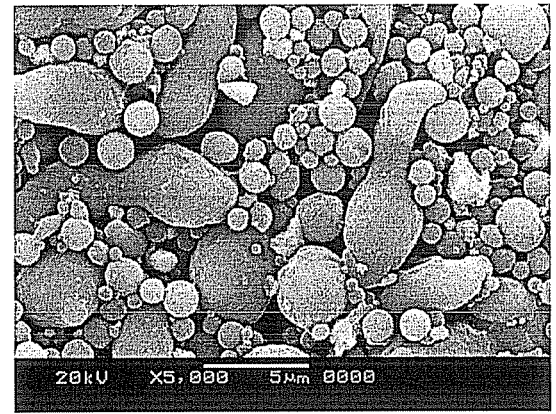
FIG. 2C is an SEM micrograph (magnification: ×5000) of a dry aluminum film as claimed in a manufacturing example.
Figure 3A:
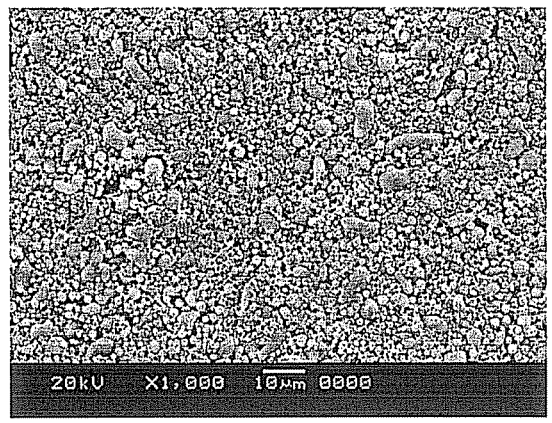
FIG. 3A is an SEM micrograph (magnification: ×1000) of a dry aluminum film as claimed in a manufacturing example.
Figure 3B:
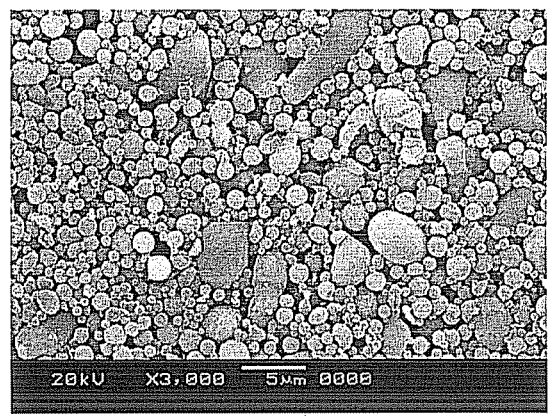
FIG. 3B is an SEM micrograph (magnification: ×3000) of a dry aluminum film as claimed in a manufacturing example.
Figure 3C:
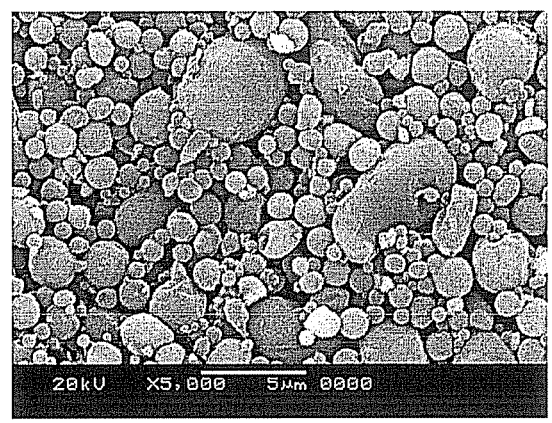
FIG. 3C is an SEM micrograph (magnification: ×5000) of a dry aluminum film as claimed in a manufacturing example.
Figure 4A:
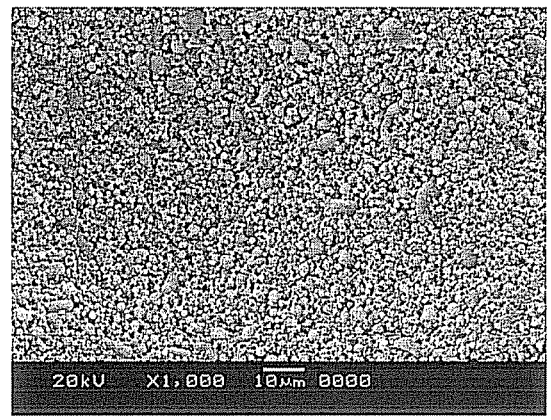
FIG. 4A is an SEM micrograph (magnification: ×1000) of a dry aluminum film as claimed in a manufacturing example.
Figure 4B:
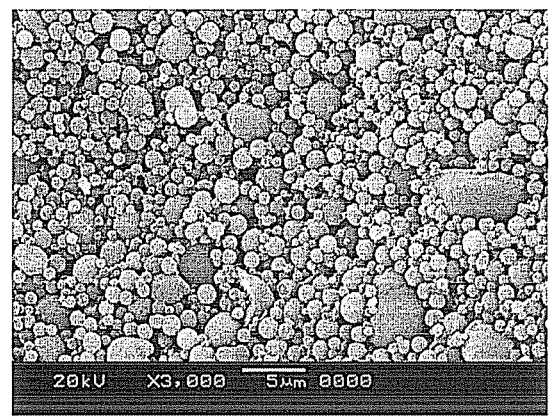
FIG. 4B is an SEM micrograph (magnification: ×3000) of a dry aluminum film as claimed in a manufacturing example.
Figure 4C:
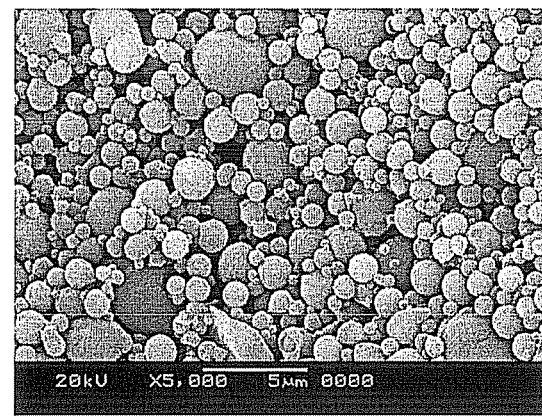
FIG. 4C is an SEM micrograph (magnification: ×5000) of a dry aluminum film as claimed in a manufacturing example.
Figure 5A:
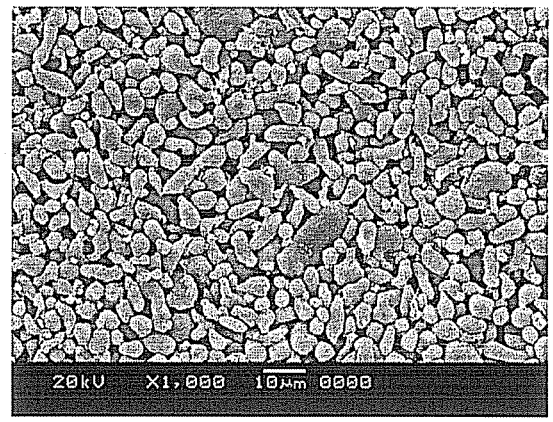
FIG. 5A is an SEM micrograph (magnification: ×1000) of a dry aluminum film as claimed in a manufacturing example.
Figure 5B:
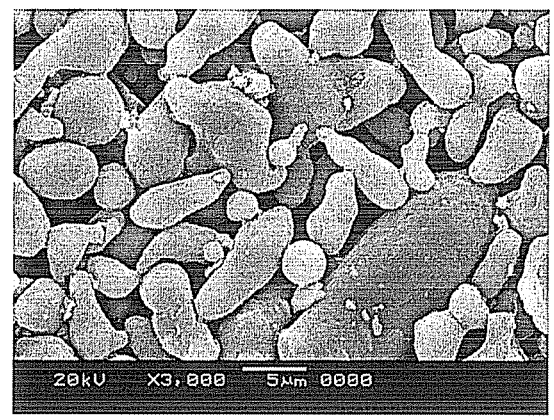
FIG. 5B is an SEM micrograph (magnification: ×3000) of a dry aluminum film as claimed in a manufacturing example.
Figure 5C:
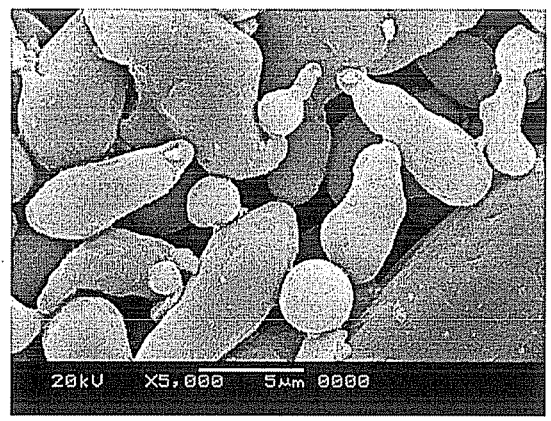
FIG. 5C is an SEM micrograph (magnification: ×5000) of a dry aluminum film as claimed in a manufacturing example.
Figure 6A:
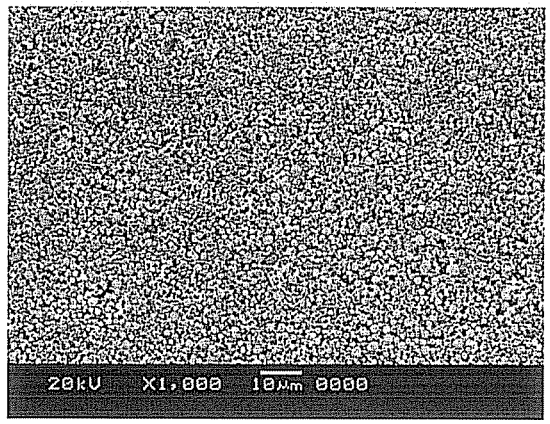
FIG. 6A is an SEM micrograph (magnification: ×1000) of a dry aluminum film as claimed in a manufacturing example.
Figure 6B:
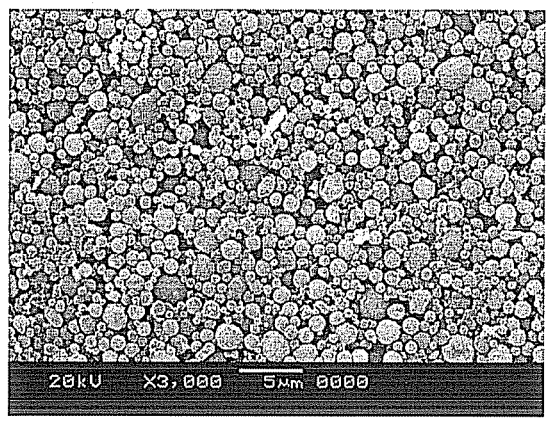
FIG. 6B is an SEM micrograph (magnification: ×3000) of a dry aluminum film as claimed in a manufacturing example.
Figure 6C:
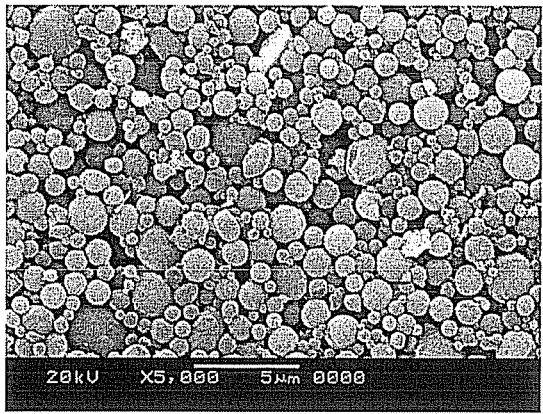
FIG. 6C is an SEM micrograph (magnification: ×5000) of a dry aluminum film as claimed in a manufacturing example.
Figure 7A:
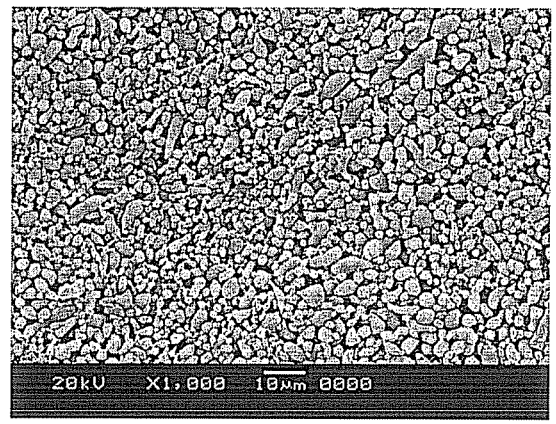
FIG. 7A is an SEM micrograph (magnification: ×1000) of a dry aluminum film as claimed in a manufacturing example.
Figure 7B:
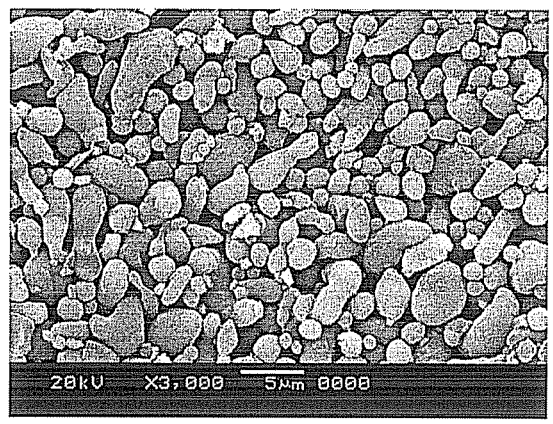
FIG. 7B is an SEM micrograph (magnification: ×3000) of a dry aluminum film as claimed in a manufacturing example.
Figure 7C:
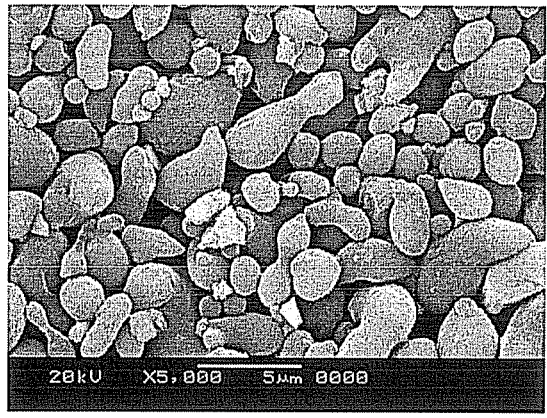
FIG. 7C is an SEM micrograph (magnification: ×5000) of a dry aluminum film as claimed in a manufacturing example.

As is clear from a comparison between SEM micrographs of dry aluminum films obtained using Sample 2 (FIGS. 2A to 2C), Sample 3 (FIGS. 3A to 3C) and Sample 4 (FIGS. 4A to 4C) and SEM micrographs of dry aluminum films obtained using Sample 7 (FIGS. 5A to 5C), Sample 8 (FIGS. 6A to 6C) and Sample 9 (FIGS. 7A to 7C), which contained only a single aluminum powder, dry films obtained from the aluminum pastes of Samples 2 to 4 using a mixed aluminum powder were finer than dry films obtained from the aluminum pastes of Samples 7 to 9 using only a single aluminum powder.

In addition, measurement of particle size distribution of the mixed aluminum powder used in the aluminum paste of Sample 3 yielded a median particle diameter of 4.1 μm. This D50 value was nearly equal to the D50 value (4.0 μm) of the non-mixed (single) aluminum powder used in Sample 9.

However, D10 of the mixed aluminum powder of Sample 3 was 1.1 μm, D90 was 8.4 μm and D10/D90 was 0.131. This

TABLE 1

| Sample No. | 1 | 2 | 3 | 4 | 5 | 6 | 7 | 8 |
|---|---|---|---|---|---|---|---|---|
| Median particle diameter of large particle diameter aluminum powder (μm) | 6.5 | 6.5 | 6.5 | 6.5 | 6.5 | 6.5 | 6.5 | — |
| Median particle diameter of small particle diameter aluminum powder (μm) | 2.2 | 2.2 | 2.2 | 2.2 | 2.2 | 2.2 | — | 2.2 |
| Mixing ratio (large/small) | 8/2 | 7/3 | 5/5 | 3/7 | 2/8 | 9/1 | 10/0 | 0/10 |
| Dry film density (g/cm$^3$) | 1.95 | 2.00 | 2.05 | 2.00 | 1.95 | 1.85 | 1.75 | 1.90 |
| Amount of warping of 20 μm film (mm) | 0.9 | 1.0 | 1.0 | 0.8 | 0.7 | 0.8 | 0.8 | 0.6 |
| Amount of warping of 30 μm film (mm) | 2.3 | 2.3 | 2.2 | 2.0 | 1.8 | 2.1 | 2.0 | 1.5 |
| Voc of 20 μm film (mV) | 600 | 602 | 603 | 601 | 600 | 598 | 595 | 595 |
| Voc of 30 μm film (mV) | 602 | 602 | 603 | 602 | 600 | 601 | 598 | 598 |

*) Voc: Open circuit voltage

TABLE 2

| Sample No. | 9 | 10 | 11 | 12 | 13 | 14 |
|---|---|---|---|---|---|---|
| Median particle diameter of large particle diameter aluminum powder (μm) | 4.0 | 5.5 | 8.5 | 6.5 | 6.5 | 4.0 |
| Median particle diameter of small particle diameter aluminum powder (μm) | — | 2.2 | 2.2 | 2.2 | 4.0 | 2.2 |
| Mixing ratio (large/small) | 10/0 | 5/5 | 5/5 | 5/5 | 5/5 | 5/5 |
| Dry film density (g/cm$^3$) | 1.80 | 2.00 | 2.05 | 2.00 | 1.90 | 1.90 |
| Amount of warping of 20 μm film (mm) | 0.9 | 1.1 | 0.9 | 0.7 | 0.8 | 0.9 |
| Amount of warping of 30 μm film (mm) | 2.1 | 2.5 | 2.0 | 2.0 | 2.0 | 2.3 |
| Voc of 20 μm film (mV) | 596 | 602 | 600 | 601 | 597 | 598 |
| Voc of 30 μm film (mV) | 601 | 603 | 601 | 601 | 601 | 602 |

*) Voc: Open circuit voltage broad particle size distribution reflects the mixing of two types of aluminum mixed powders. As is clear from a comparison of the SEM micrographs of FIGS. 3 and 7, despite similar median particle diameters, the fineness of the dry films respectively composed of the aluminum pastes of Samples 3 and 9 is considerably different.

This indicates that, in the case of forming an aluminum electrode in the form of a thin film having high fineness, it is effective to use a mixture of large particle diameter aluminum powder and small particle diameter aluminum powder as has been described above.

Test Example 2

Estimation of Warping

Solar cells were manufactured by using the aluminum pastes of the resulting Samples 1 to 14 described above to form aluminum electrodes.

More specifically, a commercially available 125 mm, square p-type single crystal silicon substrate for a solar cell (substrate thickness: 200 μm) was prepared, and the surface thereof was alkaline-etched using aqueous NaOH solution. Next, a phosphorous-containing solution was coated onto the light-receiving surface of the silicon substrate in which a texture structure was formed by the above-mentioned etching treatment, and heat treatment was then carried out to form an n-Si layer (n$^+$ layer) having a thickness of about 0.5 μm on the light-receiving surface of the silicon substrate (see FIG. 1).

Next, an anti-reflection film (titanium oxide film) having a thickness of about 50 to 100 nm was formed on the n-Si layer by plasma CVD (PECVD). Moreover, a coated film (thickness: 20 to 50 μm) serving as a front surface electrode (Ag electrode) was formed on the anti-reflection film by screen printing using a prescribed Ag paste for forming a front surface electrode (Ag electrode) (see FIG. 1).

Each of the aluminum pastes of Samples 1 to 14 was printed (coated) onto the back surface of the silicon substrate by screen printing (using stainless steel screen mesh SUS #165, and to apply similarly hereinafter) to form a dry aluminum film having a film thickness of 20 or 30 μm. Next, the silicon substrate was baked to form a baked aluminum electrode. More specifically, the silicon substrate was baked at a baking temperature of 700 to 800° C. using a near infrared high-speed baking oven in an air atmosphere.

Next, the amount of warping of the baked silicon substrate was measured. Namely, the baked silicon substrate was placed on a horizontal testing stand so that the surface on which the aluminum electrode was formed was facing upward, and the dimension in the direction of thickness of the silicon substrate between the lowest portion and the highest portion was measured. The resulting measured value was used as the amount of warping (mm) in this test example. The results for each sample are shown in the corresponding rows of Tables 1 and 2.

As shown in the tables, warping was able to be held to a low level for all samples in reflection of the thickness of the aluminum electrode being about 20 or 30 μm (when dry). Namely, warping of substrates provided with an aluminum electrode having a thickness of 20 μm (when dry) was about 0.6 to 1.1 mm, while warping of substrates provided with an aluminum electrode having a thickness of 30 μm (when dry) was about 1.5 to 2.5 mm.

Test Example 3

Measurement of Open Circuit Voltage

In this test example, silver paste for forming a back surface electrode (Ag electrode) similar to the silver paste for forming a front surface electrode (Ag electrode) described above was first screen printed in a prescribed pattern onto each of the silicon substrates on which the front surface electrode (Ag electrode) was formed in the above-mentioned Test Example 2, after which the silver paste was dried to form a back surface Ag coating having a thickness of 20 to 50 μm (namely, a back surface external connection electrode composed of Ag after baking: see FIG. 1).

Next, each aluminum paste of Samples 1 to 14 was printed (coated) by screen printing to form a dry aluminum film having a film thickness of 20 or 30 μM. Next, the silicon substrate was baked at a baking temperature of 700 to 800° C. using a near infrared high-speed baking oven in an air atmosphere. As a result of this baking, a baked aluminum electrode was formed together with a front surface electrode (Ag electrode) and back surface external connection Ag electrode.

Next, a voltmeter was connected to between the front and back Ag electrodes of the solar cell obtained in this manner (see FIG. 1) followed by measurement of maximum voltage obtained when sunlight was radiated onto the light-receiving surface, or in other words, open circuit voltage (Voc). The results for each sample are shown in the corresponding rows of Tables 1 and 2.

As shown in the tables, roughly equal open circuit voltages were obtained for cases in which the thickness of the aluminum electrode was 20 μm (when dry) and when the thickness was 30 μm (when dry). More specifically, open circuit voltages of about 600 mV or higher were obtained in the case of using mixed aluminum powders of large particle diameter aluminum powder and small particle diameter aluminum powder. This indicates that, as a result of using the paste-like composition as claimed in the present invention, effects (such as BSF effects) are able to be demonstrated when forming an aluminum electrode thinner than that of the prior art (typically having a thickness of 30 μm or less and preferably 20 μm or less) that are comparable to the formation of an aluminum electrode having conventional film thickness. In addition, reducing the thickness of the aluminum electrode also makes it possible to prevent the occurrence of warping and other deformation or cracking of the silicon substrate during baking or drying.

INDUSTRIAL APPLICABILITY

As a result of using a paste-like composition (aluminum paste) provided by the present invention, the occurrence of warping and other deformation of a silicon substrate can be avoided when forming an aluminum electrode on the silicon substrate. Thus, according to the present invention, a solar cell can be provided that realizes high precision with respect to shape and high reliability with respect to performance.

The invention claimed is:
1. A paste-like composition used in an application for forming an aluminum electrode of a solar cell,
the composition comprising:
an organic vehicle; and
an aluminum powder which is dispersed in an organic vehicle, wherein
the aluminum powder is a mixture of the following two types of aluminum powders (a) and (b):
(a) a small particle diameter aluminum powder, which has a median particle diameter (D50) of particle size distribution based on laser diffraction of 3 μm or less and a ratio of particle diameter at 10% cumulative volume (D10) to particle diameter at 90% cumulative volume (D90) is (D10/D90) of 0.2 or more; and

(b) a large particle diameter aluminum powder, which has a median particle diameter (D50) of particle size distribution based on laser diffraction that is 2 to 6 times the D50 of the small particle diameter aluminum powder and a ratio of particle diameter at 10% cumulative volume (D10) to particle diameter at 90% cumulative volume (D90) is (D10/D90) of 0.2 or more, and the mixed aluminum powder has a median particle diameter (D50) of particle size distribution based on laser diffraction of 2 μm to 6 μm, and has a ratio of particle diameter at 10% cumulative volume (D10) to particle diameter at 90% cumulative volume (D90) is (D10/D90) of less than 0.2.

2. The paste-like composition according to claim 1, wherein 70% by mass or more of the particles that compose the small particle diameter aluminum powder are spherical or shape similar thereto characterized by having an aspect ratio (ratio of the long axis to the short axis) of 1 to 1.3, and 70% by mass or more of the particles that compose the large particle diameter aluminum powder are microscopically long and narrow characterized by having an aspect ratio (ratio of the long axis to the short axis) of more than 1.3.

3. The paste-like composition according to claim 1, wherein the median particle diameter (D50) of the mixed aluminum powder is 3 μm to 5 μm.

4. The paste-like composition according to claim 1, wherein the median particle diameter (D50) of the small particle diameter aluminum powder is 1 μm to 3 μm, and the median particle diameter (D50) of the large particle diameter aluminum powder is 5 μm to 10 μm.

5. The paste-like composition according to claim 1, wherein the mass-based mixing ratio of the large particle diameter aluminum powder to the small particle diameter aluminum powder (large particle diameter aluminum powder/small particle diameter aluminum powder) is set to within a range of 8/2 to 2/8.

* * * * *